(12) United States Patent
Crouse et al.

(10) Patent No.: US 11,530,598 B2
(45) Date of Patent: Dec. 20, 2022

(54) DETERMINATION OF OIL REMOVED BY GAS VIA MISCIBLE DISPLACEMENT IN RESERVOIR ROCK

(71) Applicant: Dassault Systemes Simulia Corp., Johnston, RI (US)

(72) Inventors: Bernd Crouse, Berkeley, CA (US); Rui Xu, Burlington, MA (US); Guangyuan Sun, Burlington, MA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 704 days.

(21) Appl. No.: 16/545,387

(22) Filed: Aug. 20, 2019

(65) Prior Publication Data

US 2020/0063532 A1    Feb. 27, 2020

Related U.S. Application Data

(60) Provisional application No. 62/720,161, filed on Aug. 21, 2018.

(51) Int. Cl.
| | |
|---|---|
| *E21B 41/00* | (2006.01) |
| *E21B 49/00* | (2006.01) |
| *G01V 99/00* | (2009.01) |
| *G06T 7/60* | (2017.01) |
| *E21B 43/16* | (2006.01) |
| *E21B 43/20* | (2006.01) |

(52) U.S. Cl.
CPC .......... *E21B 41/0092* (2013.01); *E21B 49/00* (2013.01); *G01V 99/005* (2013.01); *G06T 7/60* (2013.01); *E21B 43/168* (2013.01); *E21B 43/20* (2013.01); *G06T 2207/10081* (2013.01); *G06T 2207/30181* (2013.01)

(58) Field of Classification Search
None
See application file for complete search history.

(56) References Cited

U.S. PATENT DOCUMENTS

| | | |
|---|---|---|
| 3,818,757 A | 6/1974 | Brown |
| 4,498,134 A | 2/1985 | Hansen et al. |

(Continued)

FOREIGN PATENT DOCUMENTS

| | | |
|---|---|---|
| CN | 101556687 | 10/2009 |
| CN | 102245289 | 11/2011 |

(Continued)

OTHER PUBLICATIONS

Pereira, "Fluid Flow, Relative Permeabilities and Capillary Pressure Curves Through Heterogeneous Porous Media," Applied Mathematical Modelling, May 31, 2019, vol. 75, p. 481-493.

(Continued)

*Primary Examiner* — John J Figueroa
(74) *Attorney, Agent, or Firm* — Fish & Richardson P.C.

(57) ABSTRACT

Systems, methods, and computer program products can be used for determining the amount of oil removed by a miscible gas flood. One of the methods includes identifying locations of oil within a volume representing a reservoir rock sample. The method includes identifying locations of gas within the volume. The method also includes determining the amount of oil removed based on locations within the volume where oil is either coincident with the gas or is connected to the gas by a continuous oil path.

15 Claims, 7 Drawing Sheets

(56) References Cited

U.S. PATENT DOCUMENTS

| | | |
|---|---|---|
| 4,507,726 A | 3/1985 | Grinberg et al. |
| 4,729,098 A | 3/1988 | Cline et al. |
| 4,809,202 A | 2/1989 | Wolfram |
| 4,831,519 A | 5/1989 | Morton |
| 4,860,245 A | 8/1989 | Kinoshita |
| 4,933,895 A | 6/1990 | Grinberg et al. |
| 4,969,116 A | 11/1990 | Wada et al. |
| 4,989,166 A | 1/1991 | Akasaka et al. |
| 5,038,302 A | 8/1991 | Kaufman |
| 5,159,690 A | 10/1992 | Margolus |
| 5,255,212 A | 10/1993 | Kondoh et al. |
| 5,361,385 A | 11/1994 | Bakalash |
| 5,377,129 A | 12/1994 | Molvig et al. |
| 5,408,638 A | 4/1995 | Sagawa et al. |
| 5,416,729 A | 5/1995 | Leon et al. |
| 5,424,963 A | 6/1995 | Turner et al. |
| 5,432,718 A | 7/1995 | Molvig et al. |
| 5,442,733 A | 8/1995 | Kaufman et al. |
| 5,548,694 A | 8/1996 | Frisken Gibson |
| 5,594,671 A | 1/1997 | Chen et al. |
| 5,605,517 A | 2/1997 | Sherman |
| 5,606,517 A | 2/1997 | Traub et al. |
| 5,640,335 A | 6/1997 | Molvig et al. |
| 5,848,260 A | 12/1998 | Chen et al. |
| 5,953,239 A | 9/1999 | Teixeira et al. |
| 6,318,156 B1 | 11/2001 | Dutton et al. |
| 6,516,080 B1 | 2/2003 | Nur |
| 6,915,245 B1 | 7/2005 | Hinton et al. |
| 6,928,399 B1 | 8/2005 | Watts et al. |
| 7,209,873 B1 | 4/2007 | Kliegel |
| 7,590,514 B1 | 9/2009 | Olovsson |
| 8,583,411 B2 | 11/2013 | Fung |
| 8,757,871 B2 | 6/2014 | Gruebele et al. |
| 9,058,446 B2 | 6/2015 | Lu et al. |
| 9,228,873 B2 | 1/2016 | Crouse et al. |
| 9,507,047 B1 | 11/2016 | Dvorkin et al. |
| 10,101,188 B2 | 10/2018 | Crouse et al. |
| 10,550,690 B2* | 2/2020 | Crouse ................ G01V 99/005 |
| 10,762,252 B2 | 9/2020 | Gopalakrishnan et al. |
| 11,118,449 B2* | 9/2021 | Crouse ................ E21B 49/00 |
| 2002/0173915 A1 | 11/2002 | Egermann et al. |
| 2005/0182603 A1 | 8/2005 | Freitas et al. |
| 2006/0277012 A1 | 12/2006 | Ricard et al. |
| 2007/0016389 A1 | 1/2007 | Ozgen |
| 2008/0044543 A1 | 2/2008 | McClements et al. |
| 2009/0070085 A1 | 3/2009 | Gullapalli et al. |
| 2010/0030534 A1 | 2/2010 | Reich et al. |
| 2010/0128932 A1 | 5/2010 | Dvorkin et al. |
| 2010/0156901 A1 | 6/2010 | Park et al. |
| 2010/0274543 A1* | 10/2010 | Walker ................ G01V 1/302 703/6 |
| 2010/0312535 A1 | 12/2010 | Chen et al. |
| 2011/0184711 A1 | 7/2011 | Altman et al. |
| 2011/0313744 A1 | 12/2011 | Oury et al. |
| 2012/0179436 A1 | 7/2012 | Fung |
| 2012/0191432 A1 | 7/2012 | Khataniar et al. |
| 2012/0310614 A1 | 12/2012 | Beattie et al. |
| 2013/0018641 A1 | 1/2013 | de Prisco et al. |
| 2013/0080128 A1 | 3/2013 | Yang et al. |
| 2013/0116997 A1 | 5/2013 | Sun et al. |
| 2013/0151221 A1 | 6/2013 | Chen et al. |
| 2013/0317791 A1 | 11/2013 | Danielson |
| 2014/0019053 A1 | 1/2014 | de Prisco |
| 2014/0067347 A1 | 3/2014 | Gurpinar et al. |
| 2014/0343858 A1 | 11/2014 | Crouse et al. |
| 2015/0048007 A1 | 2/2015 | Weerasooriya et al. |
| 2015/0051892 A1 | 2/2015 | Carvajal et al. |
| 2015/0059447 A1 | 3/2015 | Rickards |
| 2015/0066463 A1 | 3/2015 | Shetty et al. |
| 2015/0141303 A1 | 5/2015 | Harwell et al. |
| 2015/0142407 A1 | 5/2015 | Wakefield et al. |
| 2015/0149139 A1 | 5/2015 | Chavez et al. |
| 2015/0268080 A1 | 9/2015 | Crouse et al. |
| 2016/0003010 A1 | 1/2016 | Fornel et al. |
| 2016/0188768 A1 | 6/2016 | Gopalakrishnan et al. |
| 2016/0209256 A1 | 7/2016 | Crouse et al. |
| 2016/0307359 A1 | 10/2016 | Desbrun et al. |
| 2017/0074770 A1* | 3/2017 | Fourno ................ E21B 41/0092 |
| 2017/0198573 A1 | 7/2017 | Kim et al. |
| 2018/0329112 A1 | 1/2018 | Lee et al. |
| 2018/0253514 A1 | 9/2018 | Bryant et al. |
| 2019/0025461 A1* | 1/2019 | Wiener ................ G01V 1/181 |
| 2019/0050508 A1 | 2/2019 | Crouse et al. |
| 2019/0086250 A1 | 3/2019 | Crouse et al. |
| 2019/0154597 A1 | 5/2019 | Zhang |
| 2019/0186255 A1 | 6/2019 | Mustapha |
| 2019/0212241 A1 | 7/2019 | Crouse et al. |
| 2019/0368344 A1 | 12/2019 | Crouse et al. |
| 2021/0062638 A1 | 3/2021 | Crouse et al. |
| 2021/0406434 A1 | 12/2021 | Gopalakrishnan et al. |
| 2022/0207219 A1 | 6/2022 | Otomo et al. |

FOREIGN PATENT DOCUMENTS

| | | |
|---|---|---|
| CN | 102472649 | 5/2012 |
| CN | 103698102 | 4/2014 |
| CN | 104067290 | 9/2014 |
| CN | 104334828 | 2/2015 |
| CN | 102383783 | 6/2015 |
| CN | 105580019 | 5/2016 |
| CN | 105910996 | 8/2016 |
| CN | 106233146 | 12/2016 |
| EP | 0228915 | 7/1987 |
| GB | 2066466 | 7/1981 |
| JP | 2011/191848 | 9/2011 |
| WO | WO 1991017204 | 11/1991 |
| WO | WO 1992001993 | 2/1992 |
| WO | WO99/34308 | 7/1999 |
| WO | WO2008021652 | 2/2008 |
| WO | WO2012/071090 | 5/2012 |
| WO | WO2016/159807 | 10/2016 |
| WO | WO 2019097272 | 5/2019 |

OTHER PUBLICATIONS

Bao et al., "Lattice Boltzmann method for fluid simulations," Department of Mathematics, Courant Institute of Mathematical Sciences, New York University, Apr. 14, 2011, 44:1-16.

Catala, et al. "Fluid Flow Fundamentals." Oilfield Review, Dec. 31, 1996, 61-64.

Chatterjee et al., "A hybrid lattice Boltzmann model for solid-liquid phase transition in presence of fluid flow," Physics Letters A, Mar. 6, 2006, 351(4-5):359-367.

Chen & Ohashi, "The foundation and its application of the lattice Boltzmann method," Simulation, Nippon-Steel Technical Information Center, Ltd., Sep. 15, 1998, 17(3): 43-49 (with abstract).

Chen et al., "Lattice Boltzmann method for fluid flows," Annual review of fluid mechanics, Jan. 1998, 30(1):329-64.

CN Office Action in Chinese Appln. No. 201480049496.X; dated Dec. 18, 2017; 18 pages (with English translation).

CN Office Action in Chinese Appln. No. 201580021949.2, dated Aug. 10, 2018, 103 pages (with English translation).

Dyn et al., "Optimizing 3D Triangulations Using Discrete Curvature Analysis," Mathematical Methods for Curves and Surfaces: Oslo Jan. 1, 2001, 1:135-146.

EP Extended European Search Report in EP Appln. No. 18744797.4, dated Dec. 5, 2019, 10 pages.

EP Office Action in European Appln. No. 15764161.4-1001, dated Apr. 15, 2019, 8 pages.

EP Office Action in European Appln. No. 19192927.2 dated Jan. 7, 2020, 9 pages.

EP Supplemental European Search Report and Written Opinion, in European Appln. No. 14797363, dated Apr. 18, 2017, 11 pages.

EP Supplemental European Search Report in Appln. No. 15764161, dated Nov. 10, 2017, 9 pages.

EP Supplemental European Search Report in European Appln. No. 14832274.6, dated Apr. 3, 2017, 7 pages.

EP Supplemental European Search Report in European Appln. No. 18744797.4, dated Dec. 5, 2019, 39 pages.

(56) References Cited

OTHER PUBLICATIONS

EPO Extended European Search Report in European Appln. No. 19192927.2, dated Jan. 7, 2020, 9 pages.
Hamedi et al., "Pore-scale investigation of phase distribution and residual-oil development during secondary and tertiary solvent injection," SPE Reservoir Evaluation & Engineering. Feb. 1, 2015, 18(01):39-52.
Han et al., "Modelling of thermal contact resistance within the framework of the thermal lattice Boltzmann method," International Journal of Thermal Sciences, Oct. 1, 2008, 47(10):1276-1283.
Healy et al., "Status of Miscible Flooding Technology," 14th World Petroleum Congress, Jan. 1, 1994, 407-409.
Hoshen & Kopelman, "Percolation and cluster distribution. I. Cluster multiple labeling technique and critical concentration algorithm," Physical Review B, Oct. 15, 1976, 14:8:3438-3445.
Huang et al.; "Shan-and-Chen Type Multiphase Lattice Boltzmann Study of Viscous Coupling Effects for Two-Phase Flow in Porour Media," International Journal for Numerical Methods in Fluids, Sep. 30, 2009; 61(3):341-354.
JP Office Action in Japanese Appln. No. 2016-507600, dated Jul. 10, 2018, 23 pages (with English translation).
Karsch, "Lattice simulations of the thermodynamics of strongly interacting elementary particles and the exploration of new phases of matter in relativistic heavy ion collisions," InJournal of Physics: Conference Series 2006, 46(1):122-131.
Kovscek et al., "A Pore-Leval Scenario for the Development of Mixed-Wettability in Oil Reservoirs," Earth Science Division of Lawrence Berkeley Laboratory and Department of Chemical Engineering, prepared for U.S. Department of Energy, Sep. 1992, 1-58.
Ladd et al., "Lattice-Boltzmann simulations of particle-fluid suspensions," Journal of statistical physics, Sep. 1, 2001, 104(5-6):1191-251.
Lee et al. "A stable discretization of the lattice Boltzmann equation for simulation of incompressible two-phase flows at high density ratio," Journal of Computational Physics, Jun. 10, 2005, 206(1):16-47.
Notification of Reasons for Rejection with English Translation; JP Appln. No. 2016-514084; dated Jun. 21, 2018, 6 pages.
PCT International Search Report and Written Opinion in International Appln. No. PCT/US2019/013079, dated Apr. 1, 2019, 11 pages.
PCT International Search Report and Written Opinion, in International Appln. No. PCT/US2014/038143, dated Sep. 10, 2014, 9 pages.
PCT International Search Report and Written Opinion, in International Appln. No. PCT/US2015/021075, dated Jul. 8, 2015, 9 pages.
PCT International Search Report and Written Opinion, in International Appln. No. PCT/US2018/015408, dated Mar. 12, 2018, 6 pages.
Pepiot et al., "Numerical analysis of the dynamics of two- and three-dimensional fluidized bed reactors using an Euler-Lagrange approach," Powder Technology, Apr. 1, 2012, 220: 104-121.
Petkov et al., "Efficient LBM visual simulation on face-centered cubic lattices," IEEE Transactions on Visualization and Computer Graphics, Feb. 27, 2009, 15(5):802-14.
petrowiki.org/Miscible_flooding [online] "Miscible flooding" Aug. 19, 2013, retrieved on Oct. 10, 2019, retrieved from URL <https://petrowiki.org/Miscible_flooding>, 9 pages.
Prodanovic et al., "Investigating matrix/fracture transfer via a level set method for drainage and imbibition," Spe Journal, Mar. 1, 2010, 15(01):125-36.
Raabe, "Overview of the lattice Boltzmann method for nano-and microscale fluid dynamics in materials science and engineering," Modelling and Simulation in Materials Science and Engineering, Sep. 16, 2004, 12(6):R13-R46.
Ramstad et al., "Simulation of two-phase flow in reservoir rocks using a lattice Boltzmann method," Spe Journal, Dec. 1, 2010, 15(04):917-27.
Sohrabi et al., "Novel Insights into the Pore-scale Mechanisms of Enhanced Oil Recovery by CO2 Injection," 74th EAGE Conference and Exhibition, Jun. 4, 2012, 154529:1-14.
Sohrabi et al., "Visualisation of residual oil recovery by near-miscible gas and SWAG injection using high-pressure micromodels," Transport in Porous Media, Sep. 1, 2008, 74(2):239-57.
Tsuji et al., "Characterization of immiscible fluid displacement processes with various capillary numbers and viscosity ratios in 3D natural sandstone," Advances in Water Resources, Sep. 1, 2016, 95:3-15.
Van Den Pijl, "Computation of bubbly flows with a mass-conserving level-set method," Dissertation at Delft University of Technology, Nov. 22, 2005, 139 pages.
Xu et al., "Continuous vs Discontinuous Capillary Desaturation and Implications for IOR/EOR," InPaper SCA2018-066 presented at at the International Symposium of the Society of Core Analysts held in Trondheim, Norway, Aug. 2018, 1-10.
Yiotis et al., "Blob population dynamics during immiscible two-phase flows in reconstructed porous media," Physical Review E, Mar. 4, 2013, 87(3):1-12.
U.S. Appl. No. 07/555,754, Molvig, filed Jul. 12, 1990.
U.S. Appl. No. 07/812,881, Molvig, filed Dec. 20, 1991.
Bryant et al., "Prediction of relative permeability in simple porous media" Physical Review A vol. 46, No. 4 Aug. 15, 1992) (Year: 1992).
Burges et al., "Buoyant Mixtures of Cellular Automation Gases," Complex Systems, 1:31-50 (1987).
Chen et al., "Lattice Boltzmann Model for Stimulation of Magnetohydordynamicis," Physical Review Letters, vol. 67,No. 27 (Dec. 1991), pp. 3776-3779.
Chopard et al., Cellular Automata Model for Heat Conduction in a Fluid, Physics Letters A, vol. 126, Nos. 8, 9, pp. 476-480 (Jan. 1988).
Clougueur et al., "RAPI, A Cellular Automaton Machine for Fluid Dynamics," Complex Systems, pp. 585-597 (1987).
Demianov et al., "Density Functional Modelling in Multiphase Compositional Hydrodyanmics" Canadian J. Chem. Engine., Apr. 2011. 89:206-26.
D'Humieres et al., "2-D and 3-D Hydrodynamics on Lattice Gases," Fruhjahrstagung der Schweiz. Physikalischen Gesellschaft, vol. 59 (1986).
D'Humieres et al., "Lattice Gas Models for 3D Hydrodynamics," 2 (4), pp. 291-297 (1986).
D'Humieres et al., Numerial Simulations of Hydrodynamics with Lattice Gas Automata in Two Dimensions, Complex Systems 1:599-632 (1987).
Fredkin et al., "Conservative Logic." International Journal of Theoretical Pysics, vol. 21, Nos. ¾, pp. 219-253 (1982).
Frisch et al., "Lattice Gas Hydrodynamics in Two and Three Dimensions." Complex Systems 1:649-707 (1987).
Frisch et al., "Lattice-Gas Automata for the Navier-Stokes Equation," Physical Review Letters, vol. 56, No. 14, pp. 1505-1508 (Apr. 1986).
Ginzburg et al., "Analysis and improvement of Brinkman lattice Boltzmann schemes: Bulk, boundary, interface. Similarity and distinctness with finite elements in heterogeneous porous media" Physical Review, 2015, 91:023307-1-32.
Google Search Results, Jun. 28, 2021, 1 pp. (Year: 2021.
Hardy et al., "Molecular Dynamics of a Classical Lattice Gas: Transport Properties and Time Correlation Functions." Physical Review A, vol. 13, No. 5, pp. 1949-1961 (May 1976).
Hasslacher, Discrete Fluids: Part I: Background for Lattice Gas Automata, Los Alamos Science Special Issue, pp. 175-217 (1987).
Henon, "Isometric Collision Rules for the Four-Dimensional FCHC Lattice Gas," Complex Systems 1:475-494 (1987).
Jiang et al., "Estimation of three-phase relative permeability by simulating fluid dynamics directly on rock-microstructure images," Jan. 5, 2017, 22 pages.
Kadanoff et al., "Transport Coefficients Near the Critical Point: A Master Equation Approach," 165 Phys. Review 310 (1968).
Kadanoff, "On Two Levels" Physics Today (Sep. 1986).
Kaufman et al "Volume Graphics." IEEE, Jul. 1993, pp. 51-64.

(56) References Cited

OTHER PUBLICATIONS

Klein, "Negative Absolute Temperatures." Physical Review, vol. 104, No. 3, p. 589 (Nov. 1956).
Krummel et al. "Visualizing Multiphase Flow and Trapped Fluid Configurations in a Model Three-Dimensional Porous Medium" (Year: 2013).
Lenormand et al., "Physics of Blob Displacement in a Two-Dimensional Porous Medium," Mar. 1988, SPE Formation Evaluation, pp. 271-275.
Li et al. "GPU-based numerical simulation of multi-phase flow in porous media using multiple-relaxation-time lattice Boltzmann method" (Year: 2013).
Li et al., "Upscaled Lattice Boltzmann Method for Simulations of Flows in Heterogeneous Porous Media," Geofluids, Feb. 2017, 2017:1-12.
Lin et al., "Plasma Simulation Using the Massively Parallel Processor," NASA CP-2478, pp. 185-191 (Jul. 1987).
Margolus et al., "Cellular-Automata Supercomputers for Fluid-Dynamics Modeling." Physical Review Letters, vol. 56, No. 16, pp. 1694-1696 (Apr. 1986).
Martys et al., "Multiscale modeling of fluid transport in heterogeneous materials using discrete Boltzmann methods," Materials and Structures, Dec. 2002, 35:650-9.
Mohanty et al., Physics of Oil Entrapment in Water-Wet Rock, Feb. 1987, SPE Reservoir Engineering, pp. 113-128 (Year: 1987).
Molvig et al., "Fluid CAD That Challenges Computational Fluid Dynamics," Machine Design, Dec. 1994, 66(23):96-8.
Molvig et al., "Multi-species Lattice-Gas Automata for Realistic Fluid Dynamics," Springer Proceedings in Physics, vol. 46, pp. 206-231 (1990) (abstract only).
Molvig et al., "Removing the Discreteness Artifacts in 3D Lattice-Gas Fluids", Proceedings of the Workshop on Discrete Kinetic Theory, Lattice Gas Dynamics, and Foundations of Hydrodynamics, World Scientific Publishing Co., Pte., Ltd., Singapore (1989).
One Petro Search Results, Jan. 26, 2021, 11 pp. (Year: 2021).
Perez et al., "OUPPI-1, ASIMD Computer Using Integrated Parallel Processors." Proc. of Compar Conf. Papers Plenary Sess. and Stream A Manchester, Sep. 12-16, 1988, British Comp. Soc. Parallel Proc. Spec. Group GB.
Prodanovic et al., "Physics-Driven Interface Modeling for Drainage and Imbibition in Fractures," Sep. 2009 SPE Journal, pp. 532-542 (Year: 2009).
Qian et al., "Lattice BGK Models for Navier-Stokes Equation." Europhysics Letters, 17(6):479-484 (1992).
Ramsey, "Thermodynamics and Statistical Mechanics at Negative Absolute Temperatures." Physical Review, vol. 103, No. 1, pp. 20-28 (Jul. 1956).
Ramstad et al., "Relative Permeability Calculations from Two-Phase Flow Simulations Directly on Digital Images of Porous Rocks" Transp Porous Med (2012) 94:487-504 (Year: 2012).
Rivet, "Three-Dimensional Lattice Gas Hydrodynamical Simulations: First Results." C.R. Acad. Sci. Paris, t. 305, Series II, pp. 751-756 (1987).
Rosenblum, "Photorealistic Terrain Imaging and Flight Simulation," IEEE, 1994 pp. 10-12.
Sheng et al., "Numerical Prediction of Relative Permeability from MicroCT Images: Comparison of Steady-State versus Displacement Methods," Oct. 30-Nov. 2, 2011, SPE Annual Technical Conference and Exhibition, Denver, Colorado, 16 pages.
Suhrer et al., "Upscaling Method for Obtaining Primary Drainage Capillary Pressure andResistivity Index with Digital Rock Physics," IPTC-20035-ABSTRACT, 2020, 13 pages.
Teixeira, "Continuum Limit of Lattice Gas Fluid Dynamics." B.A. Sc. Engineering Science University of Toronto (1988).
Toffoli, "Cellular Automata as an Alternative to (Rather Than an Approximation of) Differentiation Equation in Modeling Physics." Physica 10D: 117-127 (1984).
Tucker, "Cellular Automata Machine: The Ultimate Parallel Computer," High Technology, pp. 85-87 (Jun. 1984).
Vichniac, "Cellular-Automata Fluids." Instabilities and Nonequilibrium Structures II, pp. 97-116 (1989).
Vichniac, "Stimulating Physics with Cellular Automata." Physica, 10D:96-110, 1984 (abstract only).
Wijk et al., "Three Ways to Show 3D Fluid Flow" IEEE Computer Graphics and Applications, Sep. 1994, 14(5):33-9.
Wolfram, "Cellular Automation Fluids 1: Basic Theory," J. Stat. Phys., vol. 45, Nos. ¾, pp. 471-526 (1986).
Zhang et al., "Single Component, Multiphase Fluids Flow Simulation in Porous Media with Lattice Boltzmann Method" 2012 Fourth International Conference on Computational and Information Sciences (Year: 2012).
Zhu et al., "Extending a Gray Lattice Boltzmann Model for Simulating Fluid Flow in Multi-Scale Porous Media," Sci. Rep., Apr. 2018, 8(5826):1-19.
PCT International Preliminary Report on Patentability in International Appln. No. PCT/US2019/013079, dated Jul. 14, 2020, 10 pages.

* cited by examiner

DETERMINATION OF OIL REMOVED BY GAS VIA MISCIBLE DISPLACEMENT IN RESERVOIR ROCK

CLAIM OF PRIORITY

This application claims priority under 35 USC § 119(e) to U.S. Provisional Patent Application Ser. No. 62/720,161, filed on Aug. 21, 2018 and entitled "Determination of Oil Removed by Gas via Miscible Displacement in Reservoir Rock," the entire contents of which are hereby incorporated by reference.

BACKGROUND

This disclosure relates to enhanced oil recovery from porous media, especially estimating recoverable quantities at various stages of enhanced recovery.

The production of oil from a subsurface reservoir can be categorized into three phases primary recovery, secondary recovery, and tertiary recovery. Primary recovery involves well bores that are drilled into an oil containing reservoir. Oil is recovered due to a driving force resulting from there being a higher pressure in the reservoir compared to a pressure in the well bore. Over time, reservoir pressure decreases with a concomitant decrease of this driving force to move oil towards to the well bore. In secondary recovery, brine is pushed into injection well bores to increase the reservoir pressure and restore a 'driving force' to push oil towards extraction wells, (this process is often referred to as water-flooding). The tertiary phase, often referred to as Enhanced Oil Recovery (EOR), attempts to recover oil that remains trapped in the pore space of the reservoir rock even after primary and secondary recovery. One common type of EOR method is gas injection (also called gas flooding), in which a gas is injected into the injection wells. A gas flood can be miscible (gas and oil mix) or immiscible (gas and oil remain separate phases) depending on the gas and oil fluid properties and reservoir conditions such as temperature and pressure.

Injection of miscible gases are used to maintain a reservoir pressure and are used as solvents to reduce interfacial tension between oil and water, and thus enhance displacement of hydrocarbons such as oil from water. Miscible injection is an economically viable process that significantly increases oil recovery from many different types of reservoirs. Miscible fluids that are used as solvents to increase oil recovery include carbon dioxide ($CO_2$), nitrogen (N), and other gases such as liquefied petroleum gas (LPG), propane, methane under high pressure, and methane that is enriched with other hydrocarbons.

SUMMARY

According to an aspect, a computer implemented method for determining an amount of oil recoverable from porous reservoir rock by a miscible gas flood includes identifying locations of oil within a volume of voxels representing an original state of the porous reservoir rock, identifying locations of gas within the volume of voxels representing the original state of the porous reservoir rock, and determining voxels within the volume where oil is either coincident with gas or is connected to gas by a continuous oil path to estimate the amount of oil that is recoverable from the porous reservoir rock.

Aspects also include computer program products on non-transitory computer readable medium and data processing systems such as computers.

The following are some of the additional features of one or more of the above aspects.

Identifying locations of oil further includes executing a first numerical multiphase flow simulation to obtain predictions of flow behavior of oil in the presence of a waterflood of the porous reservoir rock; and wherein identifying locations of gas further includes executing a second numerical multiphase flow simulation to obtain predictions of flow behavior for a gas flood of the porous reservoir rock.

The amount of recoverable oil removed by a direct displacement is determined based on voxels within the volume where oil is coincident with the gas. The amount of recoverable oil removed by extraction and swelling is determined based on voxels within the volume where oil is connected to the gas by a continuous oil path. The aspect(s) further include generating a digital representation from data corresponding to a three dimensional imaging of the porous reservoir rock. The aspect(s) further include analyzing the digital representation to determine characteristics of a pore space network within the digital representation. Determining voxels within the volume where oil is coincident with the gas includes performing a logical AND operation on data representing the state of the pore space after the waterflood stage and the state of the pore space after the gas flood stage. Determining voxels within the volume where oil is connected to the gas by a continuous oil path includes identifying voxels that have oil and are in a direct displacement and identifying voxels that have connected hydrocarbon phases to one or more of the voxels within the volume where oil is coincident with the gas.

The foregoing and other embodiments can each optionally include one or more of the following features, alone or in combination. The amount of oil removed by direct displacement may be determined based on locations within the volume where oil is coincident with the gas. The amount of oil removed by extraction and swelling may be determined based on locations within the volume where oil is connected to the gas by a continuous oil path.

Other features and advantages will be apparent from the following description, including the drawings, and the claims.

The details of one or more embodiments of the subject matter of this specification are set forth in the accompanying drawings and the description below. Other features, aspects, and advantages of the subject matter will become apparent from the description, the drawings, and the claims.

DESCRIPTION

Figure 1:
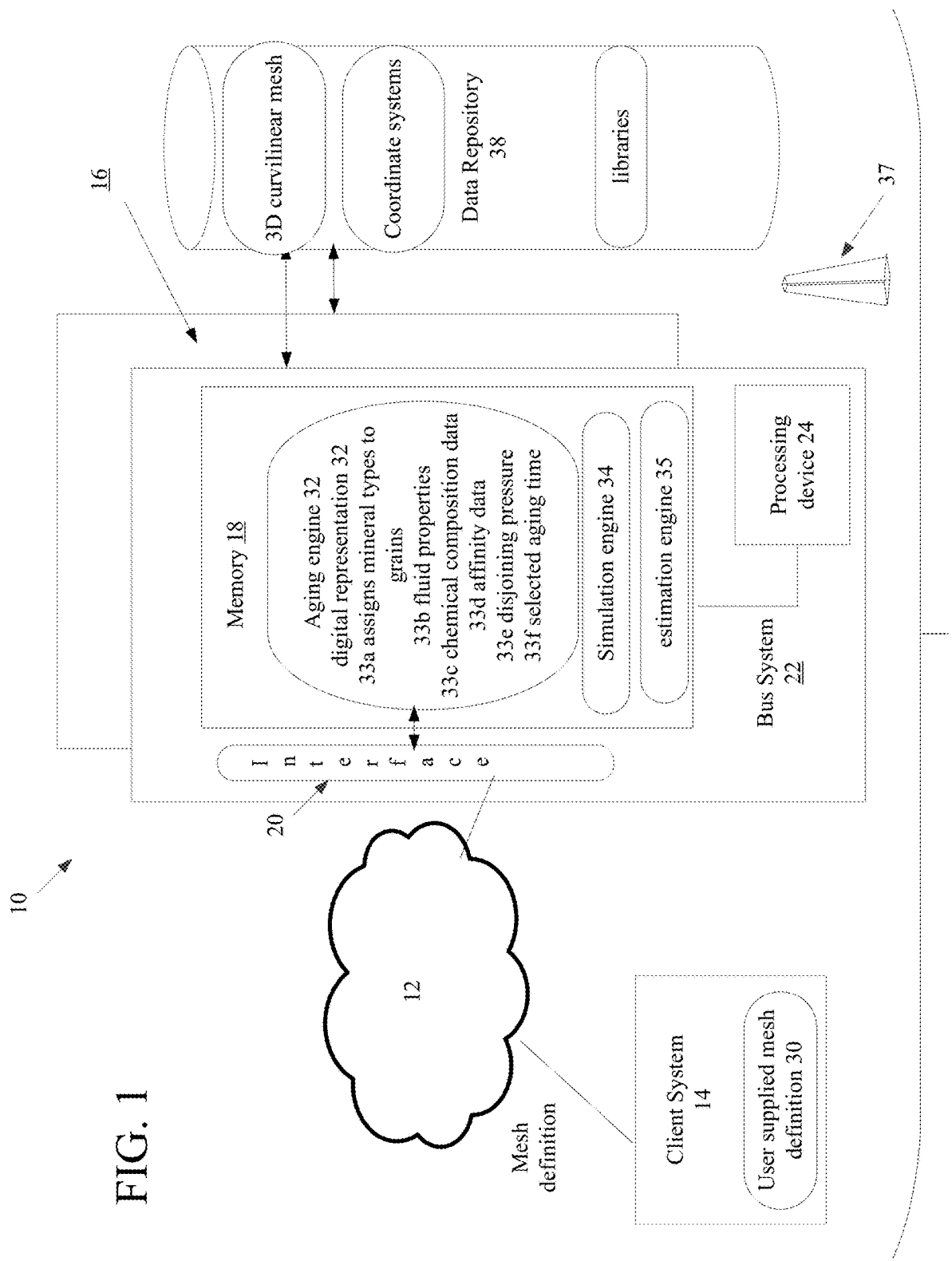
FIG. 1 depicts a system for simulation of a waterflood and a gas flood with an estimation engine to determine an amount of oil removed (recoverable) by a miscible gas flood in a subsurface reservoir.

Referring to FIG. 1, a system 10 that simulates miscible gas flooding for determining an amount of oil removed by the miscible gas flood in subsurface reservoir is shown. The system 10 in this implementation is based on a client-server or cloud based architecture and includes a server system 12 implemented as a massively parallel computing system 12 (stand alone or cloud-based) and a client system 14. The server system 12 includes memory 18, a bus system 11, interfaces 20 (e.g., user interfaces/network interfaces/display or monitor interfaces, etc.) and a processing device 24. In memory 18 are a 3D imaging engine 32 that generate a digital representation of a porous reservoir rock formation and an image analysis engine 32b that determines characteristics of the geometry of a pore space network in the porous reservoir rock formation from analysis of the digital representation of the porous reservoir rock formation. Also in memory is a simulation engine 34 that executes a numerical multiphase flow simulation for various saturation values to obtain predictions of flow behavior including relative permeability as a function of saturation through the digital representation of the porous reservoir rock formation. In some embodiments, simulating multi-phase flow behavior occurs through a reservoir rock adjacent a gas or oil well (e.g., drilling rig 37).

The digital representation of the porous reservoir rock formation and the image analysis conducted by engines 32a, 32b, respectively, which are used to determine the characteristics of the pore space network can be third party applications that are executed on a different system than server 12. The system 10 merely requires the digital representation of the formation and the analysis of the pore space network available as input to the simulation engine 34. One approach to provide the digital representation 32' of the reservoir rock sample is to obtain the representation 32', for example, from a 3D imaging of the porous reservoir rock formation that is generated from a micro CT scan of reservoir rock sample(s).

The memory 18 also stores parameters used by the engine 32, such as grain surface properties obtained by assigning mineral types 33a to the grains to determine the surface properties for each of those mineral types, and surface texture and roughness properties. The memory 18 also stores parameters such as fluid properties 33b, e.g., fluid density and viscosity of each expected fluid, (e.g., two or more of water, gas, oil) and fluid-fluid interfacial tension properties. The memory 18 also stores parameters such as chemical composition data 33c of the fluids and affinity data 33d of the fluid components for the particular mineral types. The memory 18 also stores disjoining pressure 33e for each mineral type in combination with the fluids, and a selected 33f aging time used by the aging engine 32. In addition, reservoir pressure and temperature data are also stored. The mineral types evaluated can be those found or expected at the actual site of the reservoir.

The simulation engine 34 includes a module 34a to set up the reservoir rock sample simulation environment, a module 34b to perform pore-scale numerical simulation of a waterflood, a module to perform a gas flood, and a module 34c to calculate to determine how much oil is produced by the gas flood, and how much of that produced oil is due to direct displacement versus extraction and swelling. The system 10 accesses a data repository 38 that stores 2D and/or 3D meshes, coordinate systems, and libraries that can be used in the simulations using any well-known computational technique such as computational fluid dynamics or the so called Lattice Boltzmann method.

Figure 2:
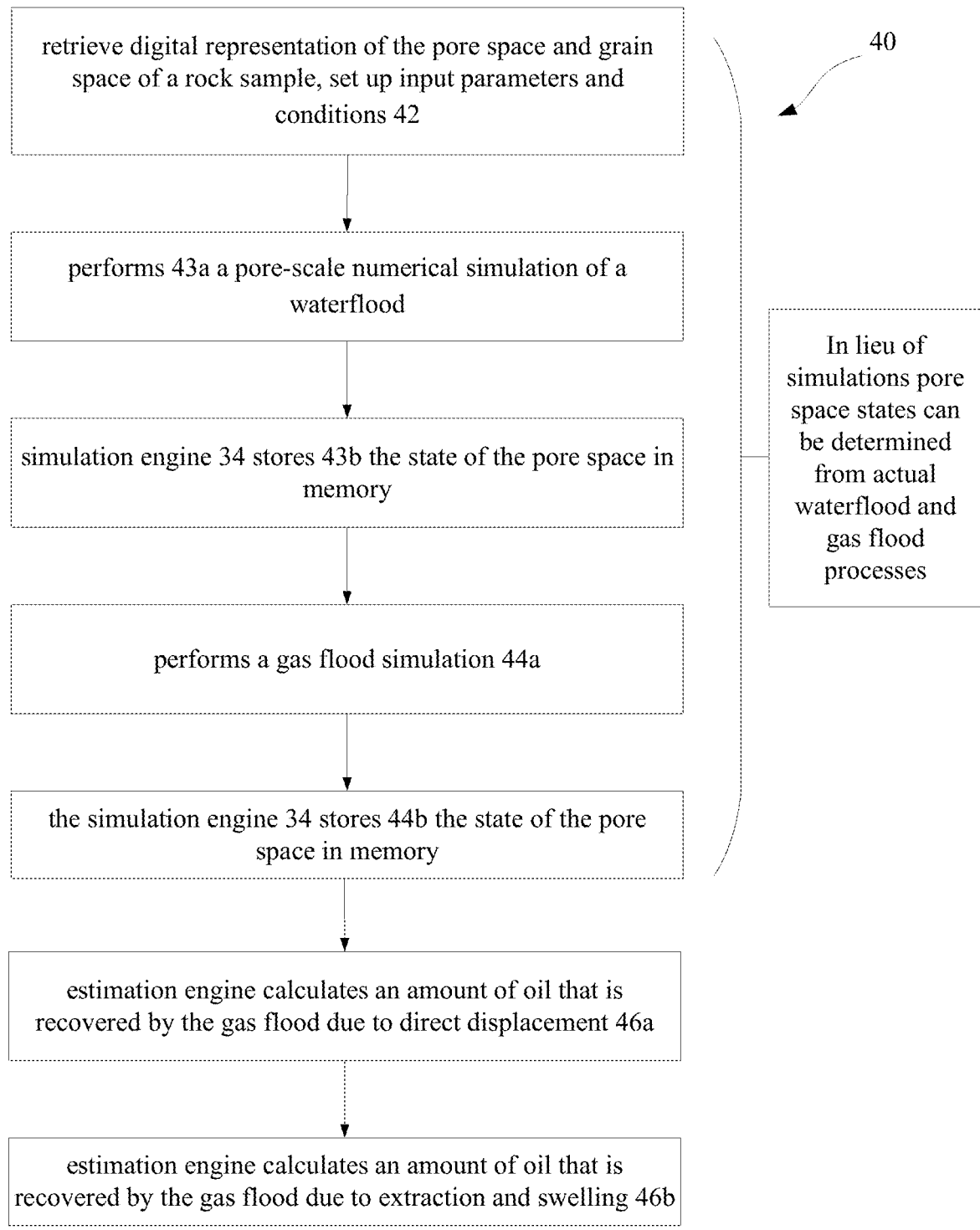
FIG. 2 depicts a flow chart showing operations for estimating recoverable oil by miscible gas flood in the subsurface reservoir.

Referring now to FIG. 2, a process 40 to determine amount of oil removed by the miscible gas flood in subsurface reservoir is shown. Upon receiving or retrieving a digital representation of the pore space and grain space of a reservoir rock sample, the simulation engine 34 sets up input parameters and conditions 42 to perform a pore-scale numerical simulation of a waterflood on a first, typically original state of the porous medium (or media). The simulation engine 34 using the set up simulation environment, performs 43a a pore-scale numerical simulation of a waterflood. Upon performing the waterflood 43a, the simulation engine 34 stores 43b the state of the pore space in memory and performs a gas flood simulation 44a using the same first, typically original state of the porous medium (or media). Upon performing the gas flood 44a, the simulation engine 34 also stores 44b the state of the pore space in memory after performance of the gas flood simulation 44a.

Using results of the simulation of the gas flood, the estimation engine 35 that can be part of the simulation engine calculates 46a an amount of oil that is recovered by the gas flood due to direct displacement and calculates 46b the amount that is recovered due to extraction and swelling. The system 10 will be described as using the LBM technique for conducting the waterflood and gas flood simulations, however as mentioned above, any of the various well-known computational techniques in computational fluid dynamics can be used.

For explanatory purposes a brief description of multiphase simulations is provided using the "Lattice Boltzmann Method" (LBM) for fluid flow simulation. Unlike other Computation Fluid Dynamic techniques that numerically solve conservation equations of macroscopic properties (i.e., mass, momentum, and energy), the LBM technique models fluids as "particles", and such particles perform consecutive propagation and collision processes over a lattice mesh made up of voxels. Voxels can be of different sizes and serve as basic unit area of fluid flow analysis. Voxels are associated with characteristics that describe the state of a fluid in a particular region (including, for example, velocity vectors that describe the velocity of the fluid in that region). During each time-step of a simulation, fluid may move from one voxel to another voxel according to the velocity vectors. Collision operators describe the effect of different fluids colliding due to the fluid movement.

The LBM technique can be implemented efficiently on scalable computer platforms and run with great robustness for time unsteady flows and complex boundary conditions. In one example, pore-scale multiphase fluid flow simulation results can be used to understand the fluid displacement mechanisms in reservoir rock. Micro-CT images of reservoir rock can be used to construct the geometry of the porosity that is used as input to each of the simulations.

The system 10 using the LBM technique determines, relative permeability and multi-phase flow through the porous media, which, in general, are dependent on various characteristics of the fluid-fluid-rock system, including rock surface properties, physical properties of each fluid, and flow conditions. One flow condition is the non-dimensional Capillary number (Ca) that represents the ratio of viscous forces over capillary forces, and is usually defined as the average fluid velocity times the viscosity of a reference fluid divided by the fluid-fluid interfacial tension. Another property is the wettability, which represents the preference of the rock surface for one fluid over another one, and manifests as a measurable property known as contact angle.

The system 10 when configured for conducting simulations of waterfloods and gas floods, is first configured for conducting the waterflood simulation on the original state of the porous medium, obtaining results, and subsequently conducting the gas flood simulation on the original state of the porous medium.

For simulating a waterflood, the simulation is set up as a two fluid simulation, with water being the one fluid that is injected into the pore space and oil being the other fluid. Simulating a waterflood process is essentially simulating a wettability alteration resulting from injection of water. The process is set up to be an iterative process where wettability alteration is performed followed by fluid phase redistribution. The process is repeated until the engine 34 determines that the wettability alteration converges (as measured by further repetitions not significantly changing the results (e.g., contact angles). The process 40 references an established threshold value that provides an amount by which a contact angle would need to vary to otherwise halt further iterations of wettability alternation simulations. One such process is disclosed in U.S. patent application Ser. No. 16/243,285, filed Jan. 9, 2019, entitled "DETERMINING FLUID FLOW CHARACTERISTICS OF POROUS MEDIUMS," the entire contents of which are incorporated herein by reference. The wettability process uses a two-phase relative permeability (kr) process to determine how easily one fluid, e.g., oil, can be moved through the in the presence of another fluid, e.g., water.

Two-phase relative permeability is an important characteristic of hydrocarbon reservoir rocks and a crucial input to oil and gas reservoir modeling and simulation activities. One technique to determine two-phase relative permeability is disclosed in U.S. patent application Ser. No. 14/277,909, filed May 15, 2014 entitled "MASS EXCHANGE MODEL FOR RELATIVE PERMEABILITY SIMULATION" published as US-2014-0343858-A1 on Nov. 20, 2014, the entire contents of which are incorporated herein by reference.

The system 10 when configured for conducting simulations of waterfloods and gas floods, may also track blobs in the formation. One technique to determine two-phase relative permeability is disclosed in U.S. patent application Ser. No. 14/660,019, filed Mar. 17, 2015 entitled "FLUID BLOB TRACKING FOR EVALUATION OF MULTIPHASE FLOW SIMULATIONS" published as US-2015-0268080-A1 on Sep. 24, 2015, the entire contents of which are incorporated herein by reference.

Upon performance of the waterflood simulation, the gas flood simulation is conducted. The simulation engine 34 is thus configured for conducting the gas flood simulation from the state of the original porous medium, e.g., the state of pore space prior to the waterflood simulation, with residual water in the pore space being one of the fluids and hydrocarbon (miscible gas+oil) being the other fluid. The gas flood simulation is conducted using the techniques discussed above, except that the simulation is configured for the hydrocarbon (combined quantities of injected gas and oil) and the residual water.

While exemplary simulation techniques for the waterflood and gas flood simulations have been described above, it is understood that these are exemplary. Thus in some implementations of estimating a predicted amount of potential oil recovery due to EOR techniques, other simulation techniques could be used. In addition, in some embodiments, actual field data of the state of a pore space can be used in lieu of conducting simulations.

The recovery of additional oil by a miscible gas flood occur by two pore-scale mechanisms. One mechanism is direct displacement, where oil is directly contacted by the injected gas, and the oil is quickly dissolved and swept away by the flowing gas. Another mechanism is extraction and swelling. Extraction and swelling is a relatively slower process than direct displacement. Extraction and swelling is a process in which oil that is connected by an oil path to the flowing gas eventually reaches the gas and dissolves into it. This process requires a diffusive mixing of fluids in which gas molecules enter the oil phase and oil molecules enter the gas phase. Gas phase which contains oil molecules is also called rich gas.

Figure 3:
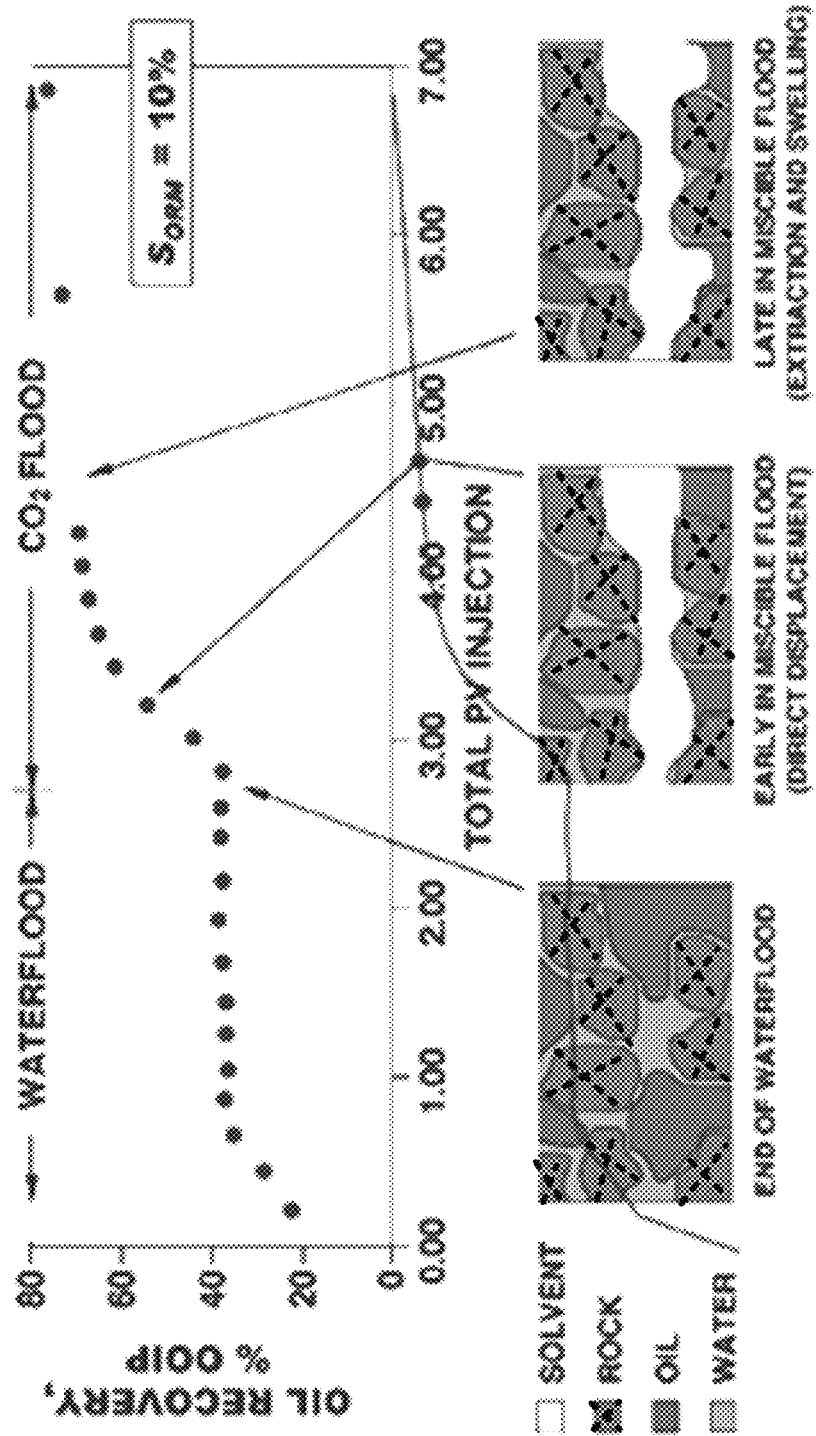
FIG. 3 depicts a graph showing oil recovery as a function of injection for a laboratory study (prior art).

FIG. 3 shows pore-scale diagrams of these two mechanisms (bottom) and an example plot of oil recovery during a waterflood followed by a gas flood, taken from https://petrowiki.org/Miscible_flooding (prior art). The graph shows a plot of percentage of Original Oil in Place (OOIP) vs. total pore volumes injected. The schematics at the bottom of FIG. 3 illustrate pore-level recovery mechanisms for each of a waterflood phase, an early miscible (or gas) flood stage, and a late miscible flood stage showing that some of the oil is recovered by displacement by solvent and some of the oil is recovered by extraction and swelling.

At the end of the waterflood, in the example, the residual oil is a discontinuous phase that occupies approximately 40% of the pore space. Early in the miscible flood [3.0 to 3.5 total pore volumes (PV) injected], some of this oil has been miscibly displaced by solvent (gas) from the higher-permeability flow path (on the pore scale). However, some oil also has been initially bypassed by solvent (gas). As depicted in the schematic view, late in the waterflood (to 7.0 total PV injected), part of the locally bypassed oil is subsequently recovered by extraction and swelling that takes place as solvent continues to flow past the bypassed oil. (The above discussion of FIG. 3, adapted from https://petrowiki.org/Miscible_flooding (prior art)).

Thus as shown in FIG. 3, the displacement process of a gas flood involves three types of fluid: water, oil, and gas.

As used herein assuming full miscibility of oil and gas, the oil and gas hydrocarbons mix and for the purposes of the described simulations, the oil and gas mix will be considered as a single hydrocarbon phase. This assumption reduces a three-phase flow simulation to a two-phase flow simulation of water and hydrocarbon (oil and gas that is treated as a single phase).

Figure 4:
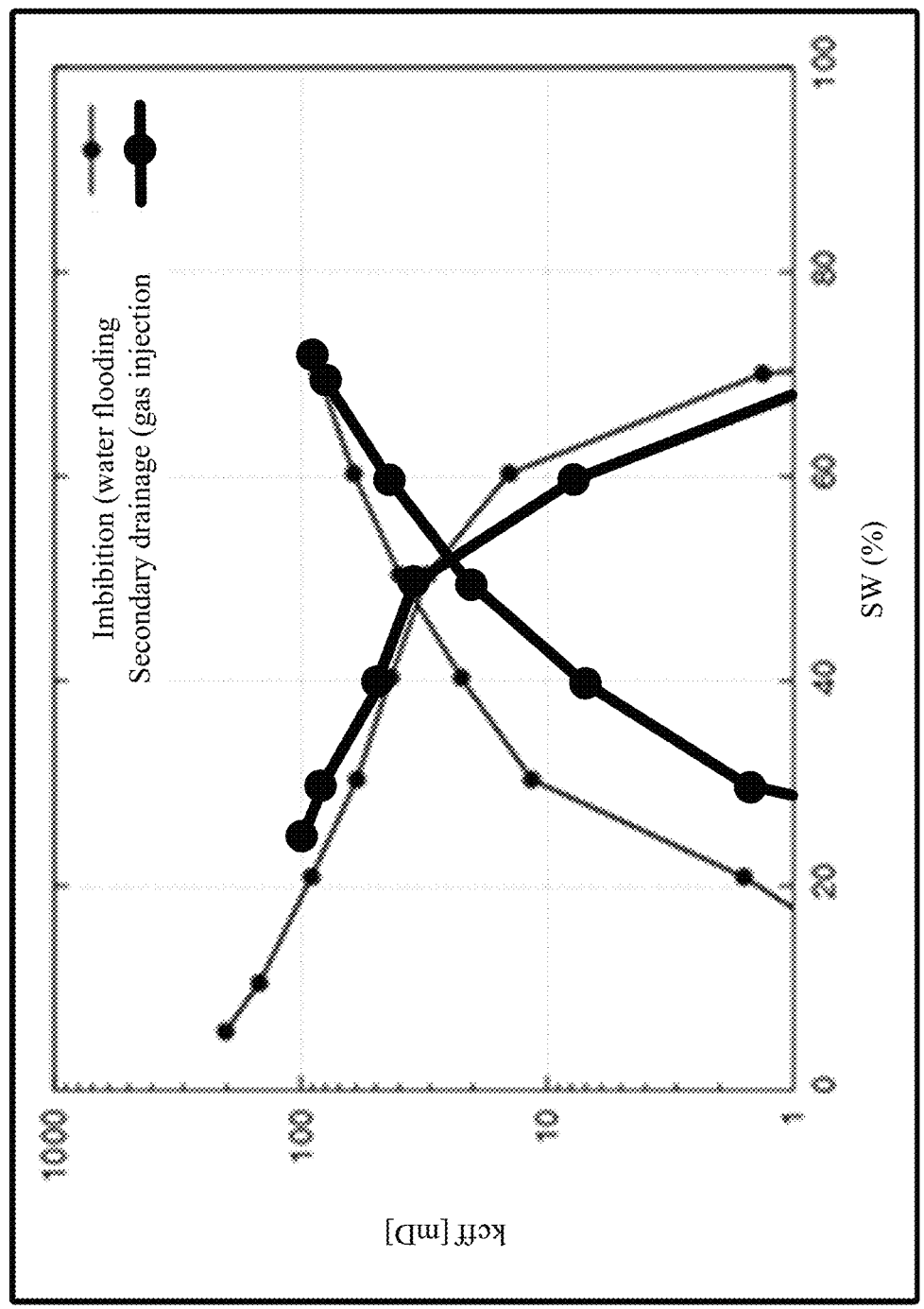
FIG. 4 depicts a graph showing relative permeability from simulation of a waterflood followed by a gas flood.

Referring to FIG. 4, an example of a set of relative permeability curves resulting from a pore-scale numerical simulation of a water flood (solid lines) followed by a gas flood (dashed lines) is shown. In the water flood procedure (narrow black lines), water displaces oil and water saturation increases (left to right) until no more oil can be displaced. For the gas flood procedure (wide black lines), gas and oil are treated as a single hydrocarbon fluid, and the water saturation decreases, as gas is injected and the combined gas-oil phase displaces water.

However, it is not straightforward to know from these results how much oil was produced during gas injection, because gas and oil are modeled as one fluid phase in the simulation. While the amount of oil produced by the waterflood is clear, it would be valuable to also be able to determine how much oil is produced by the gas flood, and how much of that produced oil is due to direct displacement versus extraction and swelling.

Figure 5:
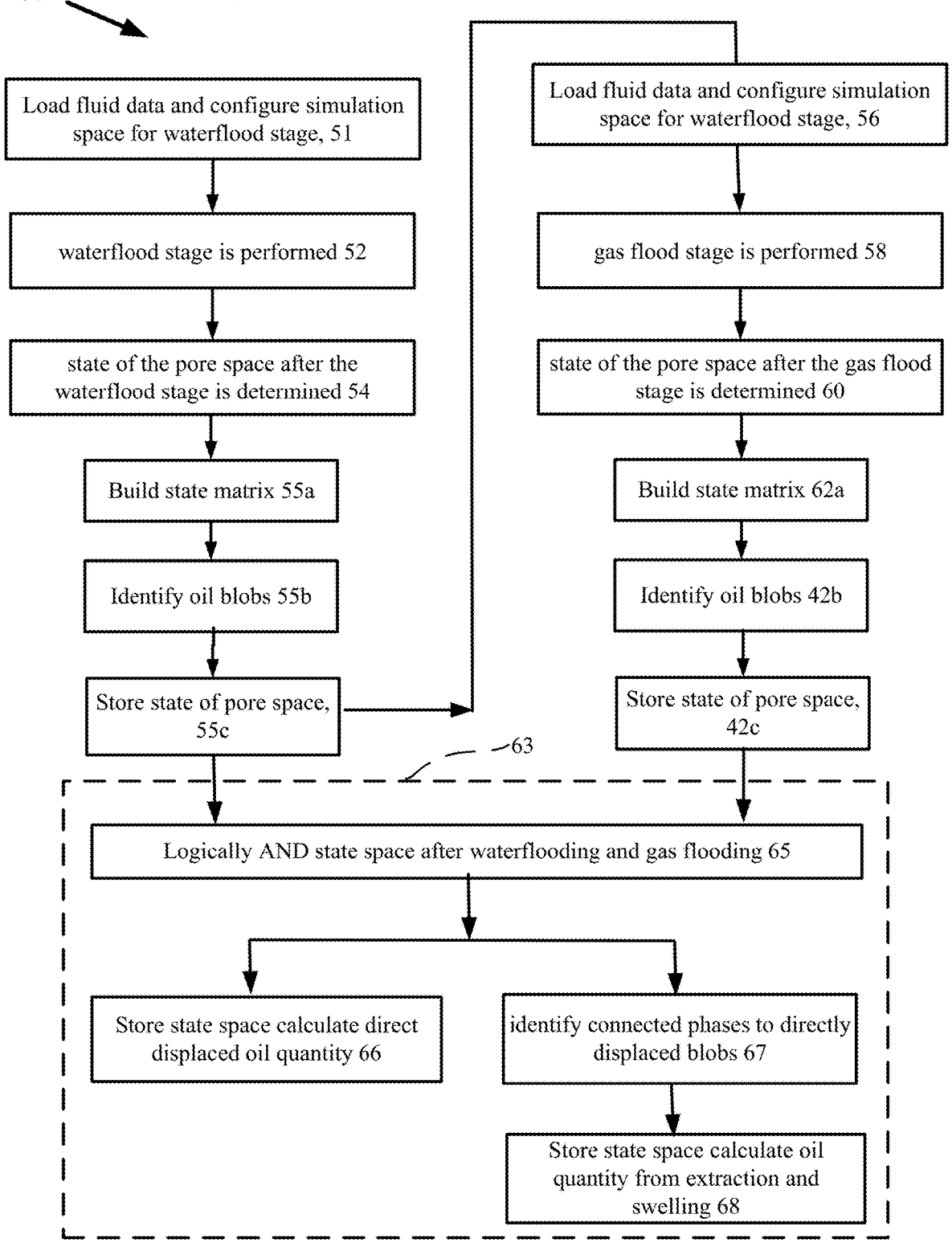
FIG. 5 is a flow chart showing operations for estimating recoverable oil.

Referring to FIG. 5, a process 50 to estimate amounts of oil recovered by the gas flood stage and the amounts of that recovered oil that result from direct displacement versus extraction and swelling is shown. The process 50 is performed by one or more computer systems including memory and processors, as shown in FIG. 1.

Fluid data are loaded and the simulation space is configured for a waterflood simulation 51. For example, a digital representation based on 3D imaging of the porous reservoir rock is used and connectivity information is derived from an analysis of the digital representation that determines the geometry of the porous space. A mesh (or a lattice grid) is affixed to the digital representation of the pore space. The mesh is comprised of voxels that represent values on the mesh in three-dimensional space. For each voxel within the mesh, there is a density for each phase (e.g., a density for water and a density for the hydrocarbon (oil only at this stage)).

A waterflood is performed 52. The waterflood can be a physical waterflood of a reservoir rock formation or a numerical simulation of the reservoir rock formation or another technique that leaves in the pore space a water background and remaining oil. The state of the pore space after the waterflood stage is determined 54 by any one of physical imaging or numerical simulation techniques or another technique. The loaded fluid data are for example from results of an actual waterflood or a simulation of a waterflood. A simulation of a waterflood would include a flow simulation through a digital representation of the pore space based on the 3D imaging of the porous reservoir rock. Connectivity information would be derived from an analysis of the digital representation that determines the geometry of the porous space.

From either the flow simulation or the actual waterflood data, a state matrix is built 55a. The state matrix identifies which cells in the simulation or actual waterflood data (derived from imaging) are identified as being part of which phase. Identifying the phase of the cell in the matrix can include comparing the density of the phases in the voxel for waterflood simulation. For example, if a cell is mostly water but contains a little oil, then the density of the water in the cell will be much higher than the density of the oil. An Atwood number can be calculated for each voxel. The Atwood number can be used to determine a weighting of how much of each phase is present in the voxel. From these data, oil blobs are identified 55b. Oil blobs (or blobs) are made up of voxels that include the target phase, here oil, and are in contact on at least one side. Blobs can be identified by employing a filling algorithm on voxels that are identified as including the target phase.

Thus, at this junction after the waterflood there is a state of the pore space of blobs and pore space that is saved 55c in computer memory. These data are processed during the simulation, and the data can include information such as blob identification numbers, blob volumes, blob locations, and other characteristics. These data can be processed to generate graphical output (for example, the depiction shown in FIG. 7A (discussed below). The processed data will also indicate where there are blobs of oil that are trapped. Trapped blobs may refer to oil in pore spaces that cannot be moved because of capillary forces.

The state of the pore space after the waterflood stage is stored 55c in computer memory as a data structure. Any of several data structure types could be used, or the data could be stored as graph structures, flat files, in databases, etc. The state of the pore space comprises location information and whether or not oil is present in each voxel after the waterflood stage.

A gas flood stage involves loading fluid data and configuring the simulation space for a gas flood 56 (using the state of the pore space at 55c). The gas flood stage uses a gas, as a solvent, which gas is any one of the gases commonly used for gas flooding, as explained above (other gases that could be used as the solvent). The gas flood stage is performed 58. The gas flood can be a physical gas flood of a reservoir rock formation or a numerical simulation of the reservoir rock formation or another technique that leaves a gas background, trapped oil and displace-able oil.

The state of the pore space after the gas flood stage is determined 60 by any one of physical imaging or numerical simulation techniques or another technique and is stored in computer memory. These data are processed during the gas flood stage simulation, and the data can include information such as the blob identification numbers, the blob volumes, the blob locations, and other characteristics. These data can be processed to generate graphical output (for example, the depiction shown in FIG. 7B (discussed below). The processed data will also indicate where there are blobs of hydrocarbon (oil and gas) that are trapped. Trapped blobs may refer to hydrocarbon (oil and gas) in pore spaces that cannot be moved because of capillary forces. As mentioned there are only two phases (gas and oil) involved in the gas flooding stage. Because when I read the paragraph, I feel the reader may think there are three phases here (gas, oil and water).

The state of the pore space after the gas flood stage is stored in computer memory as a data structure and can include building a state matrix 62a, identify oil blobs 62b and store 62c the state of the state space in memory. Any of several data structure types could be used, or the data could be stored as graph structures, flat files, in databases, etc. The state of the pore space comprises location information and whether or not hydrocarbon (oil and gas) is present in each voxel after the gas flood stage.

Subsequent to the analysis performed after the gas flood stage, the data from the waterflood stage (the state of the pore space after a waterflood simulation) and the data from the gas flood stage (the state of the pore space after gas flood simulation) are processed 63 to estimate amounts of oil recovered by the gas flood stage.

The amount of oil recovered from direct displacement can be calculated by performing 65 a logical "AND" operation on data representing the state of the pore space after the waterflood stage and on data representing state of the pore space after the gas flood stage. That is, performing the logical operation AND operation involves evaluating voxels $V_{i,j,k}$ at the end of waterflood stage that have oil (can be indicated by a logical 1 value in the state matrix), which are "ANDed" with the state of those voxels $V_{i,j,k}$ at the end of gas flood stage that have the gas. That is, direct displacement involves oil that is removed by the injected gas at locations where there is both remaining oil (after waterflood) and injected gas (after gas flood) as shown in FIG. 7c (discussed below). Thus any voxel that has combined oil and gas, i.e., hydrocarbon that voxel $V_{i,j,k}$ will be considered to have contributed its oil to oil recovery at the direct displacement stage.

The amount of oil can further be estimated by knowing the volume of a given voxel and for each of the voxel having oil and oil added the volumes of those voxels to produce a volume estimate. The estimate can be further refined by taking into consideration the density of the contents of each voxel, with voxels that have higher densities being predominantly water vs. voxels having lower densities being predominately hydrocarbons.

The state of the pore space after determining the amount of oil recovered from direct displacement is stored 66 in computer memory as a data structure. Any of the several data structure types discussed above could be used. The state of the pore space comprises location information and whether or not oil in given voxel was displaced.

To estimate amounts of oil recovered by extraction and swelling after the gas flood stage the state of the pore space after the gas flood stage (the state of the pore space after gas flooding) is analyzed to identify 67 any blobs that were recovered and which had connected hydrocarbon phases that were not contained in the estimated recovery by direct displacement. Thus a voxel $V_{i+n,j+o,k+p}$ will be considered to have contributed its oil to oil recovery at the extraction and swelling stage if voxel $V_{i+1,j+1,k+1}$ is connected to $V_{i,j,k}$ and voxel $V_{i,j,k}$ had contributed its oil to oil recovery at the direct displacement stage, where i+n, j+o, k+p are indices of arbitrary locations relative to voxel $V_{i,j,k}$.

The amount of oil recovered by extraction and swelling after the gas flood stage can further be estimated by knowing the volume of a given voxel and for each of the voxels having oil and gas added the volumes of those voxels to produce a volume estimate. The estimate can be further refined by taking into consideration the density of the contents of each voxel, with voxels that have higher densities being predominantly water vs. voxels having lower densities being predominately hydrocarbons. The process 50 can then store state space after calculated oil quantity from extraction and swelling 68.

Figure 6:
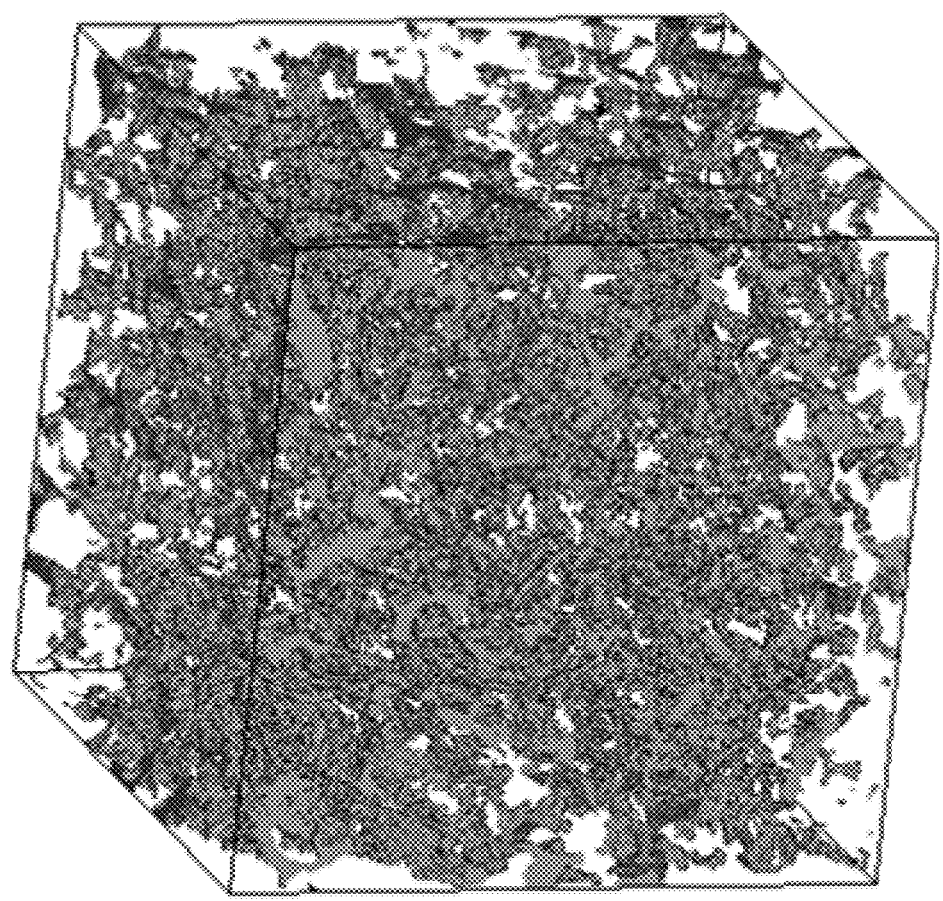
FIG. 6 is a diagrammatical view of residual oil remaining after a waterflood that is followed by a gas flood.

FIG. 6 shows an illustrative view of a three dimensional (3D) distribution of oil in pore space after a waterflood, as would be predicted by a pore-scale numerical simulation.

Referring now to FIGS. 7A-7D, these figures are two dimensional views that show rock generally 70 in different stages of oil recovery. The pore space 70 is present in reservoir rock that is indicated as very dark grey areas 72.

Figure 7A:
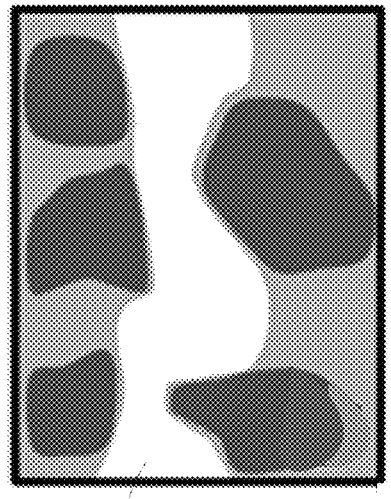
FIGS. 7A-7D are views of a pore network showing residual oil after waterflood, a gas flood, direct displacement and after swelling and extraction.

FIG. 7A shows the pore space 70 with water indicated as moderately dark grey water background 74 and remaining oil indicated as lighter outlined grey areas $S_\alpha$, at the end of a waterflood within the water background 72, as determined by any one of physical imaging or numerical simulation, or another technique.

Figure 7B:
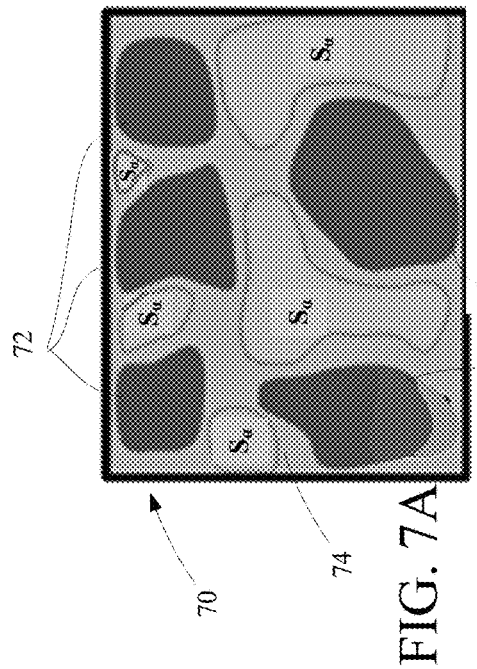
Figure 7C:
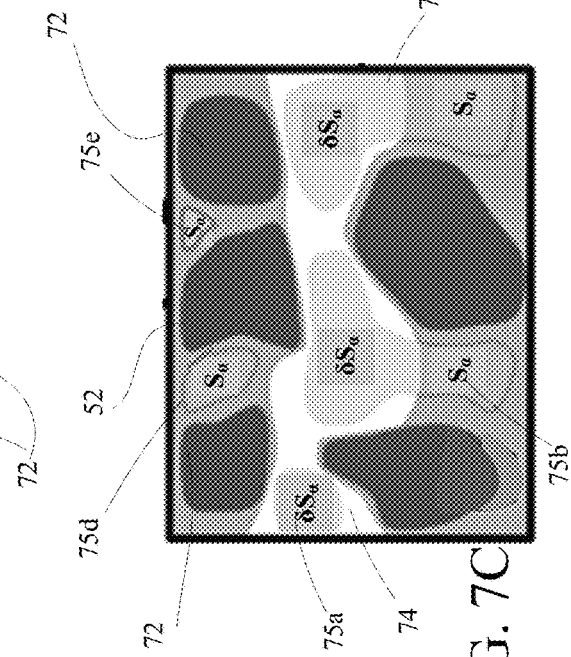

FIG. 7B shows where in this pore space 70 injected gas (white 76) flows during an ensuing gas flood, as determined by physical imaging or numerical simulation or another technique.

FIG. 7C shows the amount of oil that is remove from the pore space by the miscible gas flood. Oil is removed by the injected gas at locations where there is both remaining oil (indicated as lighter outlined grey areas $\delta S_\alpha$) and the injected gas (white 76) in the pore space 70.

Figure 7D:
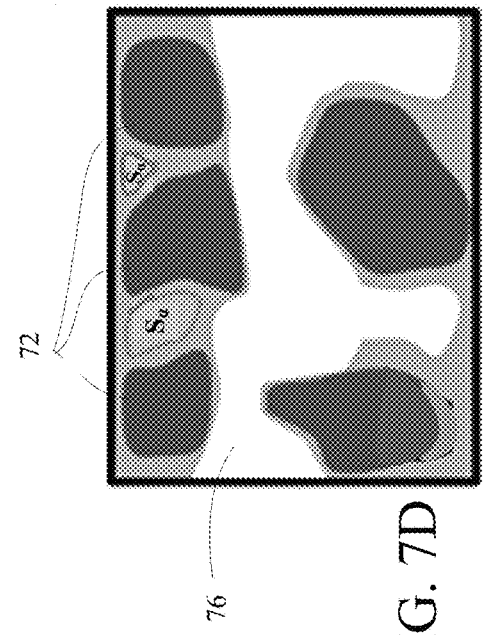

FIG. 7D shows gas phase and residual oil after swelling and extraction. During the extraction and swelling phase, after the direct displacement phase all remaining oil that was connected to the gas phase by an oil path is removed from the pore space 70. These locations where remaining oil that was connected to the gas phase are located using a connectivity test. On the other hand, only isolated oil blobs that do not have an oil path connection to the gas will remain after extraction and swelling, as shown.

Thus, also referring back to FIG. 7C, the oil blob 75a was flushed out as it lied directly in the gas path. Bobs 75b and 75c were also removed as portions of those blobs also lied directly in the gas path, and remaining portions of those blobs were connected to the portions of the blobs and hence connected to or entrained by the gas stream. On the other hand isolated oil blobs 75d, 75e remain as these blobs did not have an oil path connection to the injected gas, and thus remain in the pore space 70 after extraction and swelling.

The amount of oil removed from the pore space by the miscible gas flood is determined by calculating the amount of oil that is recovered by direct displacement: oil is removed by the injected gas at locations where there is both remaining oil ((indicated as lighter outlined grey areas $\delta S_\alpha$)) and injected gas (white 76) as shown in FIG. 7C.

Extraction and swelling thus entails determining after direct displacement, all remaining oil connected to the gas phase by an oil path that can be removed from the formation. These locations can be found using a connectivity test (e.g., having common facets or faces of a voxel, etc.). Conversely, only isolated oil blobs with no oil path connection to the gas will remain after extraction and swelling, as indicated in FIG. 7D.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs (also referred to as a data processing program) (i.e., one or more modules of computer program instructions, encoded on computer storage medium for execution by, or to control the operation of, data processing apparatus). A computer storage medium can be, or be included in, a computer-readable storage device, a computer-readable storage substrate, a random or serial access memory array or device, or a combination of one or more of them. The computer storage medium can also be, or be included in, one or more separate physical components or media (e.g., multiple CDs, disks, or other storage devices). The subject matter may be implemented on computer program instructions stored on a non-transitory computer storage medium.

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example: a programmable processor, a computer, a system on a chip, or multiple ones, or combinations, of the foregoing. The apparatus can include special purpose logic circuitry (e.g., an FPGA (field programmable gate array) or an ASIC (application specific integrated circuit)). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry (e.g., an FPGA (field programmable gate array) or an ASIC (application specific integrated circuit)).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks), however, a computer need not have such devices. Moreover, a computer can be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive)). Devices suitable for storing computer program instructions and data include all forms of non-volatile memory, media and memory devices, including by way of example, semiconductor memory devices (e.g., EPROM, EEPROM, and flash memory devices), magnetic disks (e.g., internal hard disks or removable disks), magneto optical disks, and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback) and input from the user can be received in any form, including acoustic, speech, or tactile input. In addition, a computer can interact with a user by sending documents to and receiving documents from a device that is used by the user (for example, by sending web pages to a web browser on a user's user device in response to requests received from the web browser).

Embodiments of the subject matter described in this specification can be implemented in a computing system that includes a back end component (e.g., as a data server), or that includes a middleware component (e.g., an application server), or that includes a front end component (e.g., a user computer having a graphical user interface or a Web browser through which a user can interact with an implementation of the subject matter described in this specification), or any combination of one or more such back end, middleware, or front end components. The components of the system can be interconnected by any form or medium of digital data communication (e.g., a communication network). Examples of communication networks include a local area network ("LAN") and a wide area network ("WAN"), an internetwork (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some embodiments, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, any of the above techniques that are described with reference to a pore space can also be performed with reference to or with regard to a physical media, such as a reservoir rock sample. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer implemented method for determining an amount of oil recoverable from porous reservoir rock by a miscible gas flood, the method comprising:
    identifying locations of oil within a volume of voxels representing an original state of the porous reservoir rock;
    identifying locations of gas within the volume of voxels representing the original state of the porous reservoir rock; and
    determining voxels within the volume where oil is either coincident with gas or is connected to gas by a continuous oil path to estimate the amount of oil that is recoverable from the porous reservoir rock.

2. The method of claim 1 wherein identifying locations of oil further comprises:
    executing a first numerical multiphase flow simulation to obtain predictions of flow behavior of oil in the presence of a waterflood of the porous reservoir rock; and
    wherein identifying locations of gas further comprises:
    executing a second numerical multiphase flow simulation to obtain predictions of flow behavior for a gas flood of the porous reservoir rock.

3. The method of claim 1 wherein the amount of recoverable oil removed by a direct displacement is determined based on voxels within the volume where oil is coincident with the gas.

4. The method of claim 1 wherein the amount of recoverable oil removed by extraction and swelling is determined based on voxels within the volume where oil is connected to the gas by a continuous oil path.

5. The method of claim 1 further comprising:
    generating a digital representation from data corresponding to a three-dimensional imaging of the porous reservoir rock.

6. The method of claim 1 further comprising:
    analyzing the digital representation to determine characteristics of a pore space network within the digital representation.

7. The method of claim 1 wherein determining voxels within the volume where oil is coincident with the gas comprises:
    performing a logical AND operation on data representing the state of the pore space after the waterflood stage and the state of the pore space after the gas flood stage.

8. The method of claim 7 wherein determining voxels within the volume where oil is connected to the gas by a continuous oil path, further comprises:
    identifying voxels that have oil and are in a direct displacement; and
    identifying voxels that have connected hydrocarbon phases to one or more of the voxels within the volume where oil is coincident with the gas.

9. A system for determining an amount of oil recoverable from porous reservoir rock by a miscible gas flood, the system comprising:
    one or more processor devices;
    memory operatively coupled to the one or more processor devices; and
    computer storage storing executable program instructions to cause the system to:
        identify locations of oil within a volume of voxels representing a first state the porous reservoir rock;
        identify locations of gas within the volume of voxels representing the first state the porous reservoir rock; and
        determine voxels within the volume where oil is either coincident with the gas or is connected to the gas by a continuous oil path to estimate the amount of oil that is recoverable from the porous reservoir rock.

10. The system of claim 9 wherein the instructions to identify locations of oil further comprise instructions to:
    execute a first numerical multiphase flow simulation to obtain predictions of flow behavior of oil in the presence of a waterflood of the porous reservoir rock; and
    wherein instructions to identify locations of gas further comprise instructions to:
    execute a second numerical multiphase flow simulation to obtain predictions of flow behavior for a gas flood of the porous reservoir rock.

11. The system of claim 9 wherein the amount of recoverable oil removed by a direct displacement is determined based on voxels within the volume where oil is coincident with the gas.

12. The system of claim 9 wherein the amount of recoverable oil removed by extraction and swelling is determined based on voxels within the volume where oil is connected to the gas by a continuous oil path.

13. The system of claim 9, further comprising:
    generate a digital representation from data corresponding to a three-dimensional imaging of the porous reservoir rock;
    analyze the digital representation to determine characteristics of a pore space network within the digital representation.

14. The system of claim 9 wherein determining voxels within the volume where oil is coincident with the gas comprises:
    perform a logical AND operation on data representing the state of the pore space after the waterflood stage and the state of the pore space after the gas flood stage.

15. The system of claim 14 wherein determining voxels within the volume where oil is connected to the gas by a continuous oil path, further comprises:
    identify voxels that have oil and are in a direct displacement; and
    identify voxels that have connected hydrocarbon phases to one or more of the voxels within the volume where oil is coincident with the gas.

* * * * *